US011134577B2

(12) United States Patent
Lee et al.

(10) Patent No.: US 11,134,577 B2
(45) Date of Patent: Sep. 28, 2021

(54) ELECTRONIC DEVICE INCLUDING DISPLAY MODULE INCLUDING SENSOR AND METHOD OF MANUFACTURING SAID DISPLAY MODULE

(71) Applicant: Samsung Electronics Co., Ltd., Suwon-si (KR)

(72) Inventors: Yongwon Lee, Suwon-si (KR); Youjin Kim, Suwon-si (KR); Min Park, Suwon-si (KR); Bongjae Rhee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/865,879

(22) Filed: May 4, 2020

(65) Prior Publication Data

US 2020/0359510 A1    Nov. 12, 2020

(30) Foreign Application Priority Data

May 9, 2019   (KR) .......................... 10-2019-0054183

(51) Int. Cl.
*H05K 5/00*   (2006.01)
*H05K 1/18*   (2006.01)
(Continued)

(52) U.S. Cl.
CPC ......... *H05K 5/0017* (2013.01); *G06K 9/0002* (2013.01); *H05K 1/189* (2013.01);
(Continued)

(58) Field of Classification Search
CPC ........ H05K 5/0017; H05K 1/189; H05K 5/03; H05K 2201/10128; H05K 2201/10151; G06K 9/0002
(Continued)

(56) References Cited

U.S. PATENT DOCUMENTS 9,934,418 B2   4/2018   Mienko et al.
2018/0151641 A1   5/2018   Choo et al.
(Continued)

FOREIGN PATENT DOCUMENTS

KR   10-2017-0099034 A   8/2017
KR   10-2019-0026476 A   3/2019
(Continued)

OTHER PUBLICATIONS

International Search Report dated Aug. 24, 2020, issued in International Patent Application No. PCT/KR2020/005851.

*Primary Examiner* — Sherman Ng
(74) *Attorney, Agent, or Firm* — Jefferson IP Law, LLP

(57) ABSTRACT

An electronic device including a display module is provided. The electronic device includes a housing, a display module including a cover layer forming one surface of the housing, a first panel disposed below the cover layer and including pixels, and a second panel disposed below the first panel and including a layers, and a sensor coupled to the display module and forming a sensing region on the one surface of the housing. The display module includes an opening which penetrates the second panel, and the sensor is disposed in the second panel. A thermal shrinkage film is disposed in the opening to be in contact with the first panel. The thermal shrinkage film includes a first film being in contact with the first panel and having adhesion at a temperature above a specific first temperature, and a second film including a shrinking member which contracts at a temperature above the first temperature, and a light shielding member.

23 Claims, 27 Drawing Sheets

(51) Int. Cl.
    *G06K 9/00*         (2006.01)
    *H05K 5/03*         (2006.01)

(52) U.S. Cl.
    CPC ..... *H05K 5/03* (2013.01); *H05K 2201/10128* (2013.01); *H05K 2201/10151* (2013.01)

(58) Field of Classification Search
    USPC ........................................................ 361/749
    See application file for complete search history.

(56) References Cited

U.S. PATENT DOCUMENTS

| | | |
|---|---|---|
| 2018/0225501 A1 | 8/2018 | Mienko et al. |
| 2018/0293420 A1 | 10/2018 | Kim et al. |
| 2018/0314096 A1* | 11/2018 | Yang ................... H01L 27/323 |
| 2018/0314873 A1 | 11/2018 | Yang et al. |
| 2018/0373913 A1 | 12/2018 | Panchawagh et al. |
| 2019/0050621 A1 | 2/2019 | Xu et al. |
| 2019/0205603 A1* | 7/2019 | Lee ...................... G06K 9/0002 |
| 2019/0252645 A1* | 8/2019 | Kim ................... G06K 9/00053 |
| 2019/0306295 A1* | 10/2019 | Cheng ................. H04M 1/0264 |
| 2020/0065542 A1 | 2/2020 | Jin et al. |
| 2020/0202097 A1 | 6/2020 | Kim et al. |

FOREIGN PATENT DOCUMENTS

| | | |
|---|---|---|
| KR | 10-2019-0048194 A | 5/2019 |
| KR | 10-2020-0022773 A | 3/2020 |
| KR | 10-2020-0099878 A | 8/2020 |
| KR | 10-2020-0101176 A | 8/2020 |

* cited by examiner

ELECTRONIC DEVICE INCLUDING DISPLAY MODULE INCLUDING SENSOR AND METHOD OF MANUFACTURING SAID DISPLAY MODULE

CROSS-REFERENCE TO RELATED APPLICATION(S)

This application is based on and claims priority under 35 U.S.C. § 119(a) of a Korean patent application number 10-2019-0054183, filed on May 9, 2019, in the Korean Intellectual Property Office, the disclosure of which is incorporated by reference herein in its entirety.

BACKGROUND

1. Field

The disclosure relates to an electronic device including a display module including a sensor and a method of manufacturing the display module. More particularly, the disclosure relates to an electronic device including a display module including a sensor forming a sensing region which overlaps a screen display region.

2. Description of Related Art

An electronic device may include a sensor which supports a fingerprint recognition function. The sensor providing a fingerprint recognition function may be disposed at a lower periphery of a display area or a back of a case of the electronic device in an outside of the electronic device, and the electronic device may support a fingerprint recognition function based thereon.

To increase a width of the display area of a display of the electronic device, a fingerprint sensor may be attached to a back of the display. When an in-display structure in which the fingerprint sensor is attached to the back of the display is implemented, the width of a non-display area such as a bezel around the display area may be minimized while the fingerprint sensor is disposed. In addition, when the fingerprint sensor is attached to the back of the display, a light source included in the display (e.g., a backlight unit (BLU), a light-emitting diode (LED), or an organic light-emitting diode (OLED) may be used as a light source of the fingerprint sensor without separately arranging a light source for fingerprint recognition.

Recently, as more users prefer large screens, research for increasing the screen size of a portable electronic device has been continuously made. For example, a sensor (e.g., a fingerprint sensor) disposed in a non-display area (e.g., a bezel area) of the electronic device is disposed on the display area of the display to reduce or eliminate the non-display area, thereby continuously trying to implement a large screen.

The above information is presented as background information only to assist with an understanding of the disclosure. No determination has been made, and no assertion is made, as to whether any of the above might be applicable as prior art with regard to the disclosure.

SUMMARY

In an electronic device including a sensor disposed in a display area of a display, a light shielding member (e.g., embo) may be disposed between the sensor and a panel of the display to implement mechanical reliability (e.g., rigidity and water resistance) and blackness of a screen. When the light shielding member is disposed to overlap the sensor, the light shielding member may reduce performance (e.g., a signal to noise ratio, SNR) of the sensor. Because ultrasonic impedance of an adhesive member included in the light shielding member is relatively low compared to the display or the sensor, ultrasonic mismatching may be occurred.

An opening may be formed in an area where the sensor is disposed not to overlap the light shielding member with the sensor, thereby improving performance of the sensor. When the opening is formed in the area where the sensor is disposed, the sensor may be visually recognized in the display area when a brightness of the display area is greater than or equal to a specific brightness.

In detail, when the screen of the display is turned on (e.g., a full-white background screen) or external light (e.g., sunlight) is incident on a front surface of the display, light output from the screen or external light may be reflected by an air layer of the opening formed on a back surface of the display panel. The reflected light may be introduced into a light-emitting device layer (e.g., active-matrix organic light-emitting diode (AMOLED)). The light introduced into the light-emitting device layer may generate a photoelectric effect on a thin film transistor (TFT) of a pixel.

When the screen is turned off and there is no incident external light, the sensor may be not visually recognized by the photoelectric effect, but an area where the sensor is mounted may be visually recognized by reflectance difference between the light shielding member and the air layer of the opening. In addition, a gap may occur between the light shielding member and the sensor in consideration of a deviation in attaching the light shielding member and forming the opening, and thus the sensor may be visually recognized in the display area.

Aspects of the disclosure are to address at least the above-mentioned problems and/or disadvantages and to provide at least the advantages described below. Accordingly, an aspect of the disclosure is to provide a display solving a problem in which a sensor is visually recognized in a display area while improving performance of the sensor, a display module including a sensor coupling structure, and an electronic device including the display module.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a display module including a cover layer forming one surface of the housing, a first panel disposed below the cover layer and including a plurality of pixels, and a second panel disposed below the first panel and including a plurality of layers, and a sensor coupled to the display module and forming a sensing region on the one surface of the housing, the display module may include an opening which penetrates the second panel, the sensor disposed in the second panel, a thermal shrinkage film may be disposed in the opening to be in contact with the first panel, and the thermal shrinkage film may include a first film in contact with the first panel and having adhesion at a first temperature, which is greater than or equal to 60° C. and less than or equal to 80° C. and a second film including a shrinking member, which contracts at a temperature greater than or equal to the first temperature, and a light shielding member.

In accordance with another aspect of the disclosure, an electronic device is provided. The electronic device includes a housing, a display module including a cover layer forming one surface of the housing, a first panel disposed below the cover layer and including a plurality of pixels, and a second panel disposed below the first panel and including a plurality of layers, and a sensor coupled to the display module and forming a sensing region on the one surface of the housing, the display module may include an opening which penetrates the second panel. the sensor disposed in the second panel, a thermal expansion film may be disposed in the opening to be in contact with the first panel, and the thermal expansion film may include a flow initiator having fluidity at a first temperature, which is greater than or equal to 60° C. and less than or equal to 80° C., a photo initiator reacting to ultraviolet (UV) light, and a light shielding member.

In accordance with another aspect of the disclosure, an electronic device is provided. The electronic device includes a housing, a display module including a cover layer forming one surface of the housing, a first panel disposed below the cover layer and including a plurality of pixels, and a second panel disposed below the first panel and including a plurality of layers, and a sensor coupled to the display module and forming a sensing region on the one surface of the housing, the display module may include an opening which penetrates the second panel, the sensor disposed in the second panel, a film may be disposed in the opening to be in contact with the first panel, a resin may be applied to a gap between the film and the second panel, and the film may include a light shielding member and an ultrasonic transmitting member disposed on at least one surface of the light shielding member.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
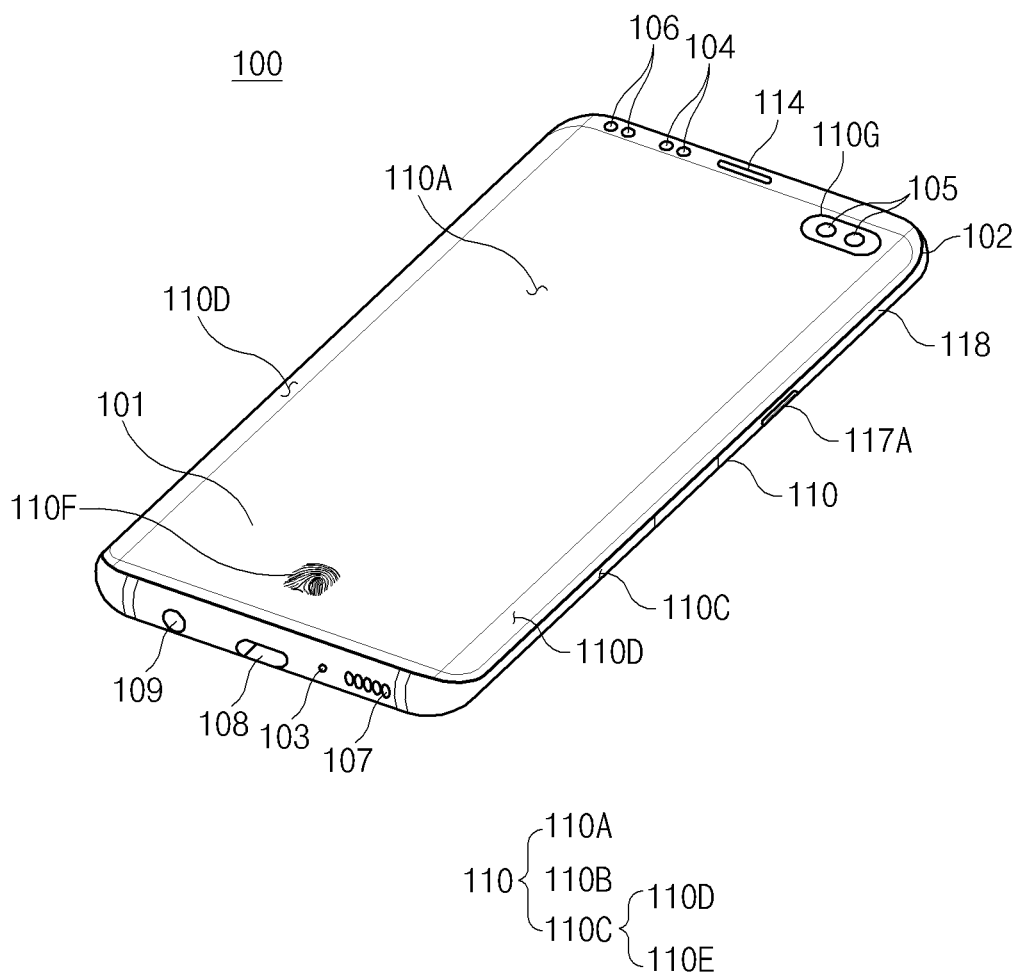
FIG. 1 is a front perspective view of an electronic device according to an embodiment of the disclosure.

FIG. 1 is a front perspective view of an electronic device according to an embodiment of the disclosure.

Figure 2:
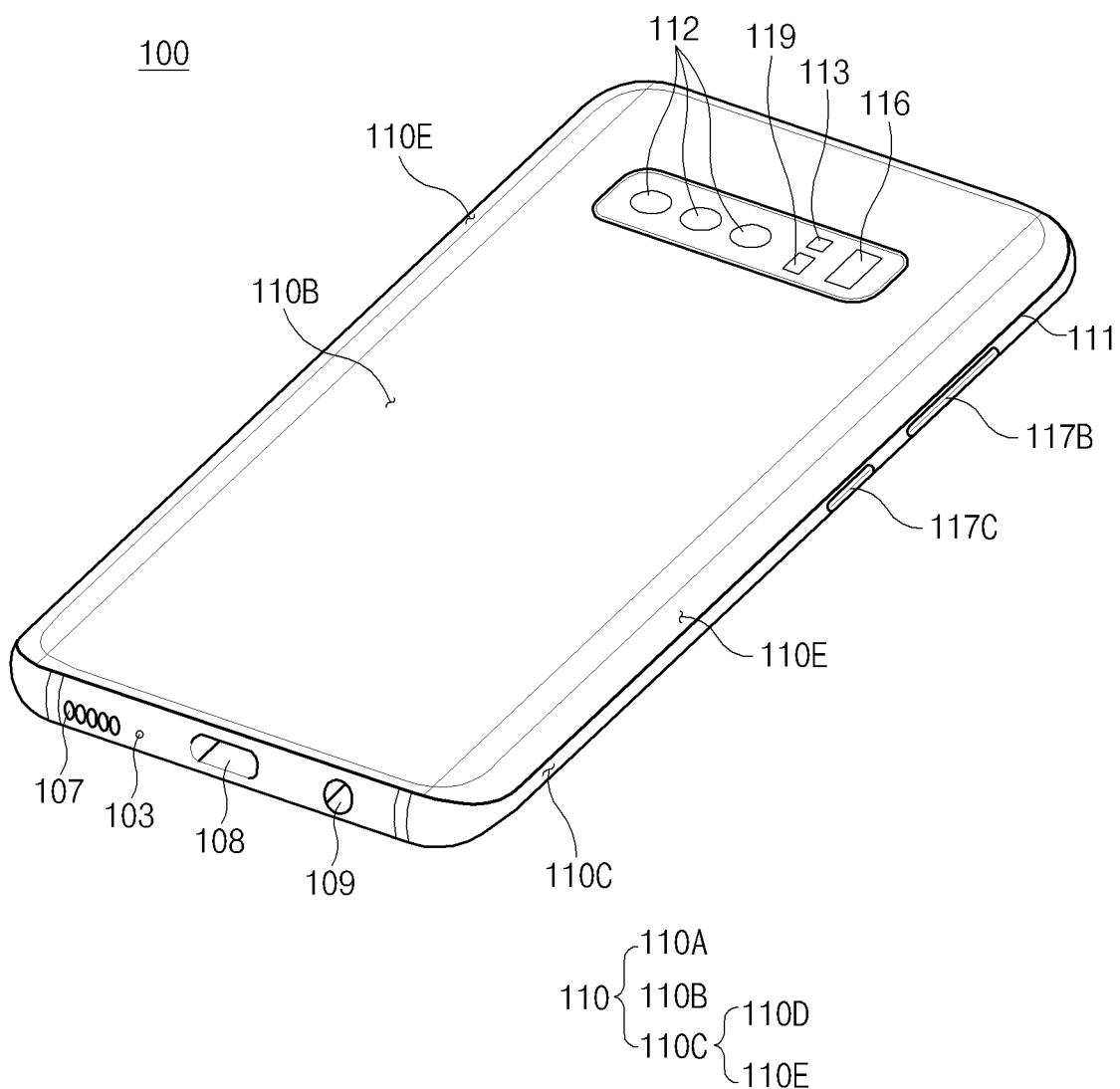
FIG. 2 is a rear perspective view of an electronic device illustrated in FIG. 1 according to an embodiment of the disclosure.

FIG. 2 is a rear perspective view of the electronic device shown in FIG. 1 according to an embodiment of the disclosure.

Referring to FIGS. 1 and 2, an electronic device 100 according to an embodiment may include a housing 110 including a first surface (or a front surface) 110A, a second surface (or a back surface) 110B, and a side surface 110C surrounding a space between the first surface 110A and the second surface 110B.

In another embodiment (not illustrated), the housing 110 may refer to a structure that forms a part of the first surface 110A, the second surface 110B, and the side surfaces 110C of FIG. 1.

According to an embodiment, the first surface 110A may be implemented with a front plate 102 (e.g., a glass plate including various coating layers, or a polymer plate), at least a portion of which is substantially transparent. The second surface 110B may be formed by a back plate 111 that is substantially opaque. For example, the back plate 111 may be formed by, a coated or colored glass, a ceramic, a polymer, a metal (e.g., aluminum, stainless steel (STS), or magnesium), or a combination of at least two of the materials. The side surface 110C may be coupled to the front plate 102 or the back plate 111 and may be implemented with a side bezel structure (or a "side member") 118 including metal and/or polymer.

In an embodiment, the back plate 111 and the side bezel structure 118 may be integrally formed and may include the same material (e.g., a metal material such as aluminum).

In the illustrated embodiment, the front plate 102 may include two first regions 110D, which are bent toward the back plate 111 from the first surface 110A so as to be seamlessly extended, at opposite long edges of the front plate 102.

In embodiment that is illustrated in FIG. 2, the back plate 111 may include two second regions 110E, which are bent toward the front plate 102 from the second surface 110B so as to be seamlessly extended, at opposite long edges of the back plate 111.

In an embodiment, the front plate 102 (or the back plate 111) may include only one of the first regions 110D (or the second regions 110E). In another embodiment, the front plate 102 (or the back plate 111) may not include a portion of the first regions 110D (or the second regions 110E).

In the embodiments, when viewed from the side of the electronic device 100, the side bezel structure 118 may have a first thickness (or width) on one side where the first regions 110D or the second regions 110E are not included, and may have a second thickness on one side where the first regions 110D or the second regions 110E are included. The second thickness may be smaller than the first thickness.

According to an embodiment, the electronic device 100 may include at least one or more of a display 101, an audio module (103, 107, 114), a sensor module (104, 116, 119), a camera module (105, 112, 113), key input devices (117A, 117B, 117C), a light-emitting device 106, and a connector hole (108, 109). In an embodiment, the electronic device 100 may not include at least one (e.g., the key input devices 117A, 117B, 117C or the light-emitting device 106) of the components or may further include any other component.

The display 101 may be exposed, for example, through a considerable portion of the front plate 102. In an embodiment, at least a portion of the display 101 may be exposed through the first surface 110A and the front plate 102 forming the first regions 110D of the side surface 110C.

In an embodiment, a corner of the display 101 may be formed to be mostly identical to a shape of an outer portion of the front plate 102 adjacent thereto. In another embodiment (not illustrated), to increase the area where the display 101 is exposed, a difference between an outer portion of the display 101 and an outer portion of the front plate 102 may be formed mostly identically.

In an embodiment, a surface (or the front plate 102) of the housing 110 may include a screen display region that is formed as the display 101 is visually exposed. For example, the screen display region may include the first surface 110A and the first regions 110D on the side surface.

In the illustrated embodiment, the screen display regions 110A and 110D may include a sensing region 110F configured to acquire biometric information of a user. Here, meaning of "the screen display regions 110A and 110D include the sensing region 110F" may mean that the sensing region 110F at least partially overlaps the screen display regions 110A and 110D. In other words, it may mean that the sensing region 110F displays visual information by the display 101 like the other regions of the screen display regions 110A and 110D, and is capable of obtaining biometric information (e.g., fingerprints) of the user, additionally.

In the illustrated embodiment, the screen display regions 110A and 110D of the display 101 may include an region 110G to which the first camera device 105 (e.g., a punch hole camera) is capable of visually being exposed. An edge of the region 110G to which the first camera device 105 is exposed may be at least partially surrounded by the screen display regions 110A and 110D. In various embodiments, the first camera device 105 may include a plurality of camera devices.

In another embodiment (not illustrated), a recess or an opening may be defined in a portion of the screen display region of the display 101, and at least one or more of the audio module 114, the first sensor module 104, and the light-emitting device 106 may be provided to be aligned with the recess or the opening.

In another embodiment (not illustrated), at least one or more of the audio module 114, the sensor module (104, 116, 119), and the light-emitting device 106 may be provided on the back surface of the display 101, which corresponds to the screen display regions 110A and 110D.

In another embodiment (not illustrated), the display 101 may be combined with a touch sensing circuit, a pressure sensor capable of measuring the intensity (or pressure) of a touch, and/or a digitizer capable of detecting a magnetic stylus pen or may be disposed adjacent thereto.

In an embodiment, at least a portion of the sensor modules (104, 116, 119), and/or at least a portion of the key input devices (117A, 117B, 117C) may be disposed in the side surface 110C (e.g., the first regions 110D and/or the second regions 110E).

The audio module (103, 107, 114) may include the microphone hole 103 and the speaker hole (107, 114). A microphone for obtaining external sound may be disposed within the microphone hole 103; in an embodiment, a plurality of microphones may be disposed to make it possible to detect a direction of sound. The speaker hole (107, 114) may include the external speaker hole 107 and the receiver hole 114 for call. In an embodiment, the speaker hole (107, 114) and the microphone hole 103 may be implemented with one hole, or a speaker (e.g., a piezoelectric speaker) may be included without the speaker hole (107, 114).

The sensor module (104, 116, 119) may generate an electrical signal or a data value that corresponds to an internal operation state of the electronic device 100 or corresponds to an external environment state. The sensor module (104, 116, 119) may include, for example, the first sensor module 104 (e.g., a proximity sensor) disposed on the first surface 110A of the housing 110, the second sensor module 116 (e.g., a time of flight (TOF) camera device) disposed on the second surface 110B of the housing 110, the third sensor module 119 (e.g., a hear rate monitor (HRM) sensor) disposed on the second surface 110B of the housing 110, and/or a fourth sensor module (e.g., a sensor 190 of FIG. 3) (e.g., a fingerprint sensor) coupled to the display 101.

In various embodiments, the second sensor module 116 may include the TOF camera device for distance measurement.

According to various embodiments, at least a portion of the fourth sensor module (e.g., the sensor 190 of FIG. 3) may be disposed below the screen display regions 110A and 110D. For example, the fourth sensor module may be disposed in a recess (e.g., a recess 139 of FIG. 3) formed on the back surface of the display 101. That is, the fourth sensor module (e.g., the sensor 190 of FIG. 3) may be not exposed to the screen display regions 110A and 110D and may form the sensing region 110F in at least a portion of the screen display regions 110A and 110D.

In an embodiment (not illustrated), the fingerprint sensor may be disposed on the second surface 110B as well as the first surface 110A (e.g., the screen display regions 110A and 110D) of the housing 110.

In various embodiments, the electronic device 100 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or the illumination sensor.

The camera module (105, 112, 113) may include the first camera device 105 positioned on the first surface 110A of the electronic device 100, and the second camera device 112 and/or the flash 113 positioned on the second surface 110B.

In the illustrated embodiment, the first camera device 105 may be exposed through a portion of the screen display region 110D of the first surface 110A. For example, the first camera device 105 may be exposed to a portion of the screen display region 110D through an opening (not illustrated) formed in a portion of the display 101.

In the illustrated embodiment, the second camera device 112 may include a plurality of camera devices (e.g., dual cameras, triple cameras). However, the second camera device 112 is not necessarily limited to including the plurality of camera devices, and may also include one camera device.

The camera devices 105 and 112 may include one or more lenses, an image sensor, and/or an image signal processor. The flash 113 may include, for example, a light-emitting diode or a xenon lamp. In an embodiment, two or more lenses (e.g., an infrared camera and wide-angle and telephoto lenses) and image sensors may be disposed on one surface of the electronic device 100.

The key input devices (117A, 117B, 117C) may be disposed on the side surface 110C of the housing 110. In another embodiment, the electronic device 100 may not include all or a part of the key input device (117A, 117B, 117C), and the key input device not included may be implemented on the display 101 in the form of a soft key. In an embodiment, the key input device may include a sensor module (e.g., the sensor 190 of FIG. 3) forming the sensing region 110F included in the screen display regions 110A and 110D.

The light-emitting device 106 may be disposed, for example, on the first surface 110A of the housing 110. The light-emitting device 106 may provide status information of the electronic device 100, for example, in the form of light. In another embodiment, the light-emitting device 106 may provide, for example, a light source that operates in conjunction with an operation of the first camera device 105. The light-emitting device 106 may include, for example, a light-emitting diode (LED), an IR LED, and a xenon lamp.

The connector hole (108, 109) may include the first connector hole 108 that is capable of accommodating a connector (e.g., a USB connector) for transmitting/receiving a power and/or data to/from an external electronic device, and/or the second connector hole (or an earphone jack) 109 that is capable of accommodating a connector for transmitting/receiving an audio signal to/from the external electronic device.

Figure 3:
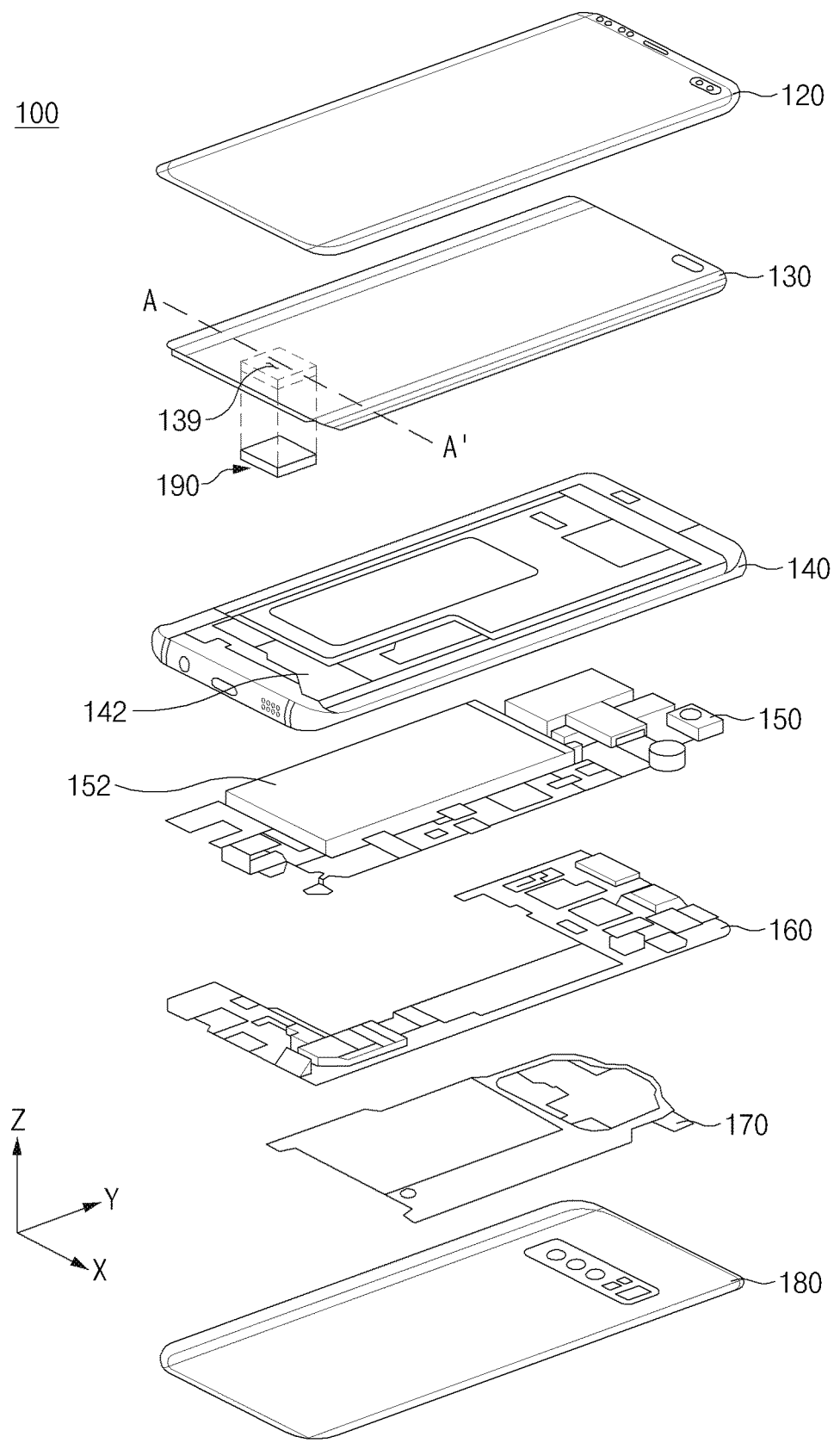
FIG. 3 is an exploded perspective view of an electronic device illustrated in FIG. 1 according to an embodiment of the disclosure.

FIG. 3 is an exploded perspective view of an electronic device shown in FIG. 1 according to an embodiment of the disclosure.

Referring to FIG. 3, the electronic device 100 may include a side member 140, a first support member 142 (e.g., a bracket), a front plate 120, a display 130 (e.g., the display 101 of FIG. 1), a printed circuit board 150, a battery 152, a second support member 160 (e.g., a rear case), an antenna 170, and a back plate 180. In an embodiment, the electronic device 100 may not include at least one (e.g., the first support member 142 or the second support member 160) of the components or may further include any other component. At least one of the components of the electronic device 100 may be identical or similar to at least one of the components of the electronic device 100 of FIG. 1 or 2, and thus, additional description will be omitted to avoid redundancy.

The first support member 142 may be disposed within the electronic device 100 and may be connected with the side member 140, or may be integrally formed with the side member 140. The first support member 142 may be formed of, for example, a metal material and/or a nonmetal material (e.g., a polymer). The display 130 may be coupled to one surface of the first support member 142, and the printed circuit board 150 may be coupled to an opposite surface of the first support member 142. A processor, a memory, and/or an interface may be mounted on the printed circuit board 150. For example, the processor may include one or more of a central processing unit, an application processor, a graphics processing device, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, a secure digital (SD) card interface, and/or an audio interface. The interface may electrically or physically connect, for example, the electronic device 100 with an external electronic device and may include a USB connector, an SD card/MMC connector, or an audio connector.

The battery 152 that is a device for supplying a power to at least one component of the electronic device 100 may include, for example, a primary cell incapable of being recharged, a secondary cell rechargeable, or a fuel cell. At least a portion of the battery 152 may be disposed on substantially the same plane as the printed circuit board 150, for example. The battery 152 may be integrally disposed within the electronic device 100, or may be disposed to be removable from the electronic device 100.

The antenna 170 may be interposed between the back plate 180 and the battery 152. The antenna 170 may include, for example, a near field communication (NFC) antenna, an antenna for wireless charging, and/or a magnetic secure transmission (MST) antenna. For example, the antenna 170 may perform short range communication with an external device or may wirelessly transmit/receive a power necessary to charge. In another embodiment, an antenna structure may be implemented with a portion of the side member 140 and/or the first support member 142, or with a combination thereof.

In the illustrated embodiment, the electronic device 100 may further include the sensor 190 coupled to the display 130. The sensor 190 may be disposed in the recess 139 (e.g., an opening 225 of FIG. 4) formed on the back surface of the display 130. The sensor 190 may form a sensing region (e.g., the sensing region 110F of FIG. 1) on a portion of the first plate 120.

Figure 4:
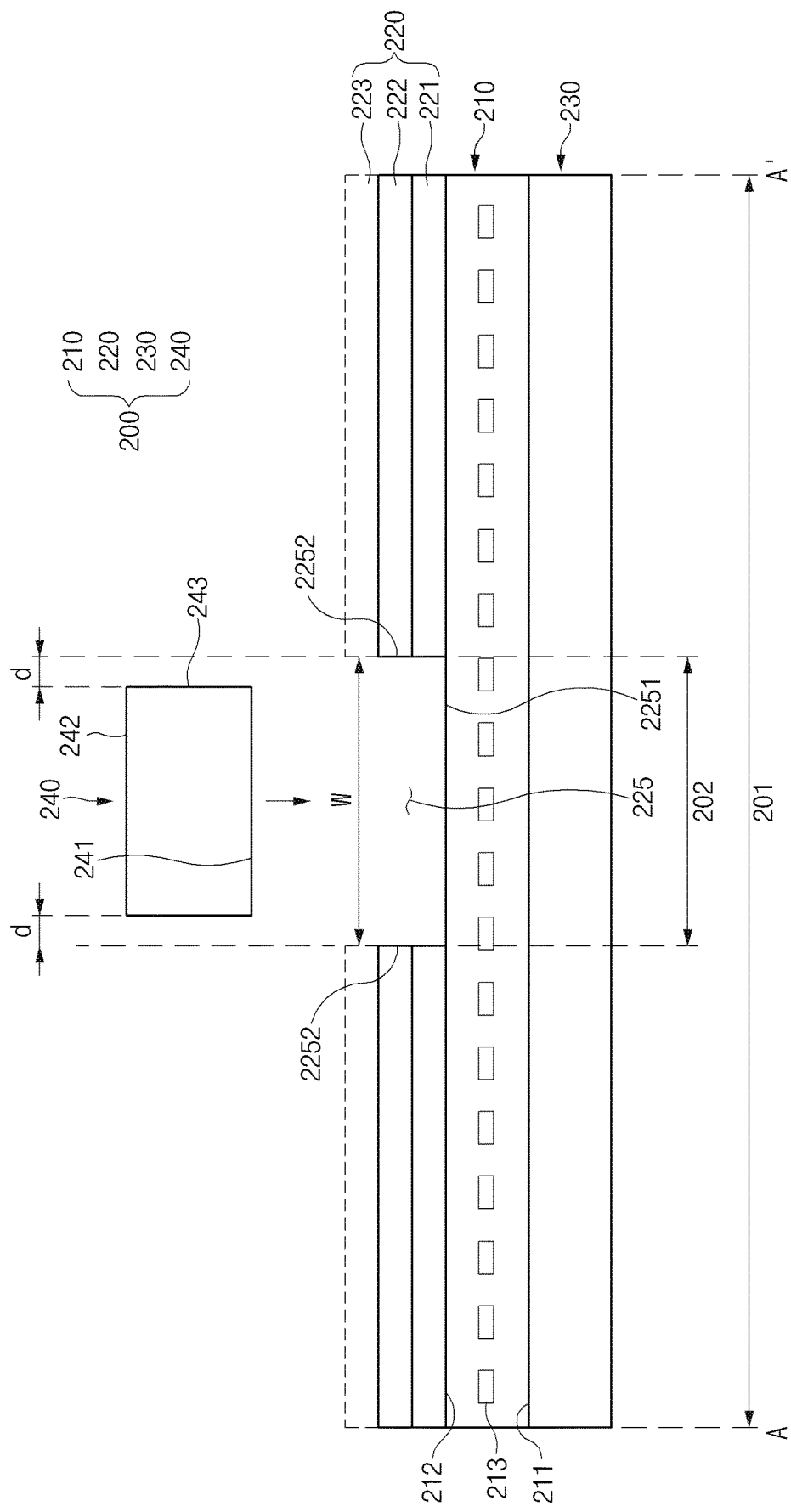
FIG. 4 is a cross-sectional view of a display module of an electronic device according to an embodiment of the disclosure.

FIG. 4 is a cross-sectional view of a display module 200 of the electronic device 100 according to an embodiment of the disclosure. FIG. 4 is a cross-sectional view along the line A-A' of FIG. 3.

Hereinafter, it may be understood that the display module 200 disclosed herein includes displays 210, 220, and 230 (e.g., the display 130 of FIG. 3) and a sensor 240 (e.g., the sensor 190 of FIG. 3).

In the illustrated embodiment, the display module 200 includes a first panel 210 including a plurality of pixels, a cover layer 230 disposed on a first surface 211 of the first panel 210 (e.g., a +Z axis direction), a second panel 220 disposed on a second surface 212 of the first panel 210 (e.g., a −Z axis direction), and the sensor 240 coupled to the first panel 210. The first panel 210 may be disposed between the second panel 220 and the cover layer 230.

In the illustrated embodiment, the first panel 210 may include the first surface 211 facing a first direction (e.g., the +Z axis direction) and the second surface 212 facing a second direction opposite to the first direction (e.g., the −Z axis direction). The first direction may be, for example, a direction toward the front surface of the electronic device 100 (e.g., the direction toward the first plate 120 in FIG. 3) and the second direction may be, for example, a direction toward the back surface of the electronic device 100 (e.g., the direction toward the second plate or the back plate 180 in FIG. 3).

In the illustrated embodiment, the cover layer 230 may form at least a portion of the first plate (e.g., the first plate 120 of FIG. 3), at least a portion of the cover layer 230 may form a first surface (e.g., the first surface 110A of FIG. 1) of a housing (e.g., the housing of FIG. 1), or may form a surface of the electronic device 100.

In various embodiments, the cover layer 230 may be formed to be transparent. The cover layer 230 may include a transparent material. In various embodiments, the cover layer 230 may be made of various materials. For example, the material may be made of glass, polyimide, or the like.

In various embodiments, in the cover layer 230, a screen display region 201 may be formed by the first panel 210 disposed in the second direction (e.g., the −z axis direction) of the cover layer 230. In addition, a sensing region 202 may be formed in the cover layer 230 by the sensor 240. For example, the sensing region 202 and the screen display region 201 may be formed to overlap each other at least a portion.

In various embodiments, the sensor 240 may transmit/receive a signal (e.g., an optical signal or an ultrasonic signal). The signal passes from the sensor 240 through the sensing region 202 toward a part of the user's body (e.g., a fingerprint of a finger), and the signal reflected by the part of the user's body may pass through the sensing region 202 to proceed to the sensor 240.

In the illustrated embodiment, the first panel 210 may include a pixel layer including the plurality of pixels. The pixel layer may form the screen display region 201 on the first plate (e.g., the first plate 120 of FIG. 3) (or the front surface of the electronic device 100). In an embodiment, the first panel 210 may include a touch layer (not illustrated) including a plurality of touch sensors.

In the illustrated embodiment, the second panel 220 may include a cushion layer 221 for supporting the first panel 210 and a shielding layer 222 for shielding noise of the display module 200 from another electrical element (e.g., electrical devices disposed on a printed circuit board). According to an embodiment, the shielding layer 222 may be a copper (Cu) sheet.

In various embodiments, the cushion layer 221 may include layers for buffering an impact applied to the first panel 210. For example, the cushion layer 221 may include an embo layer. The embo layer may mean a layer on which an embossed pattern is formed. The cushion layer 221 may include a cushion material for absorbing shock.

In an embodiment, the second panel 220 may further include a heat dissipation layer 223 for radiating heat of the display module 200. In various embodiments, the heat dissipation layer 223 may include a graphite material.

In the second panel 220 illustrated in FIG. 4, although illustrated as the cushion layer 221 is disposed on the first panel 210, the shielding layer 222 is disposed on the cushion layer 221, and the heat dissipation layer 223 is disposed on the shielding layer 222, it is not necessarily limited thereto. For example, the second panel 220 disclosed herein may be stacked in a different order from the layers 221, 222, and 223 illustrated in FIG. 4, further include an additional layer, or some layers may be omitted.

In the illustrated embodiment, the display module 200 may include an opening 225 penetrating through the second panel 220. The opening 225 may pass through the second panel 220 to expose the second surface 212 of the first panel 210 when viewed in the second direction (e.g., the −Z axis direction). In this case, the sensor 240 may be disposed in the opening 225. The opening 225 may be formed larger than the sensor 240 such that inner walls 2252A, 2252B, and 2252C are spaced apart from a side surface 243 of the sensor 240 by a specific distance "d".

In the illustrated embodiment, the opening 225 may include a bottom surface 2251, and the inner walls 2252A, 2252B, and 2252C facing one another. The bottom surface 2251 may include a portion of the second surface 212 of the first panel 210. The inner walls 2252A, 2252B, and 2252C may include end surfaces of a plurality of layers (e.g., 221, 222, and 223) included in the second panel 220.

In the illustrated embodiment, the sensor 240 may include a first surface 241 disposed to face the first panel 210, a second surface 242 opposite the first surface 241, and the side surface 243 formed between the first surface 241 and the second surface 242.

In various embodiments, the first surface 241 of the sensor 240 may be attached to the bottom surface 2251 of the opening 225 and the side surface 243 of the sensor 240 may be spaced apart from the inner wall 2252 of the opening 225 by the specific distance "d" to be inserted into the opening 225.

Hereinafter, the sensor 240 disclosed in various embodiments of the disclosure may include an ultrasonic sensor. The ultrasonic sensor may be configured to acquire biometric information (e.g., a structure of a fingerprint) of a user using ultrasonic waves having a specific frequency. As the ultrasonic sensor has a higher frequency, resolution may be improved.

In various embodiments, the ultrasonic sensor may transmit the ultrasonic waves toward a part of the user's body that is adjacent to (e.g., in contact with) the sensing region 202 (e.g., the sensing region 110F of FIG. 1) formed in the cover layer 230 and receive the ultrasonic waves reflected on the part of the user's body to obtain the biometric information. For example, the sensor 240 may be an ultrasonic fingerprint sensor for acquiring fingerprint information of the user, and the biometric information may be a structure of the fingerprint of the user.

Figure 5:
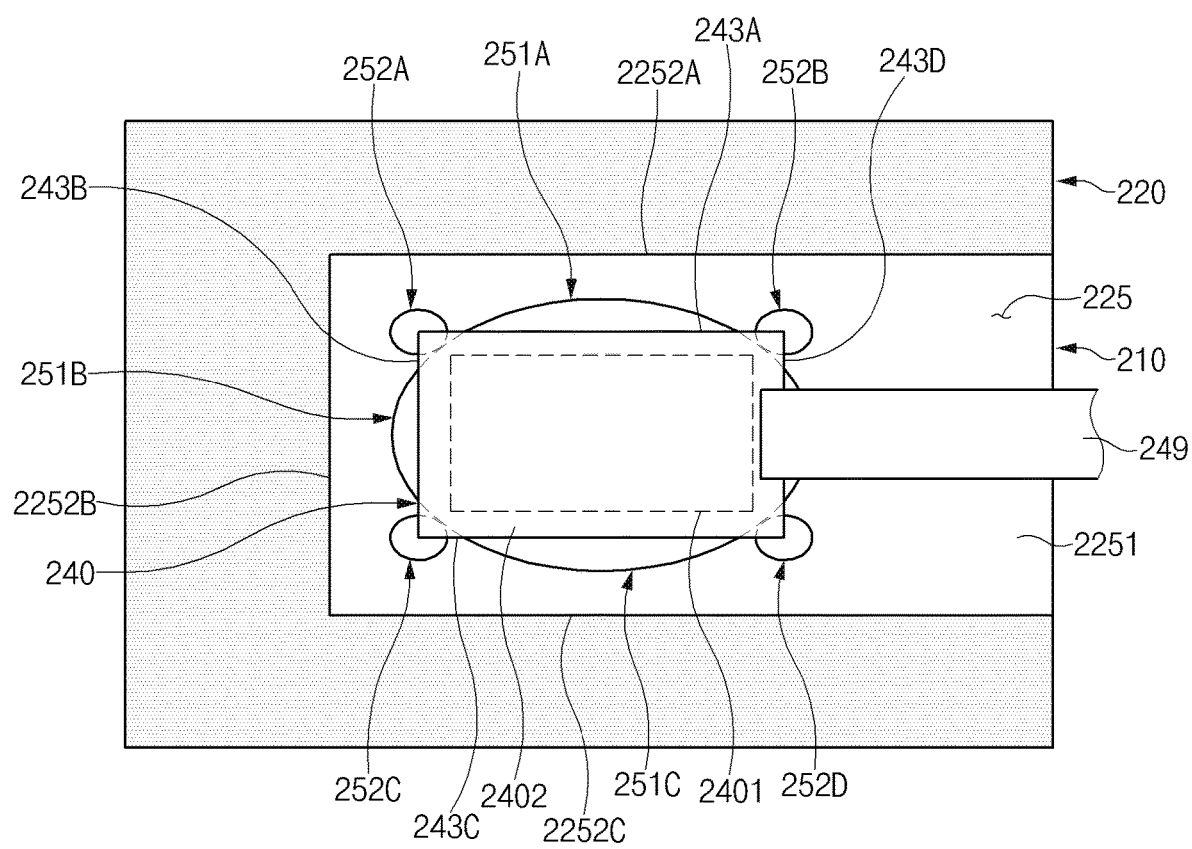
FIG. 5 is a view illustrating a coupling structure of a sensor of an electronic device according to an embodiment of the disclosure.

FIG. 5 is a view illustrating a coupling structure of the sensor 240 of the electronic device 100 according to an embodiment of the disclosure.

In the illustrated embodiment, the sensor 240 may include an active region 2401 capable of obtaining the biometric information of the user and an inactive region 2402 formed around the active region 2401. The sensor 240 may include a configuration (e.g., an ultrasonic transmitting/receiving module) directly related to a sensing function under the active region 2401. The inactive region 2402 may be, for example, a region in which components related to semiconductor packaging (e.g., connection terminals, etc.) are disposed.

In the illustrated embodiment, the electronic device 100 may include at least one of first adhesive regions 251A, 251B, and 251C and at least one of second adhesive regions 252A, 252B, 252C, and 252D.

In various embodiments, the first adhesive regions 251A, 251B, and 251C may be formed between the sensor 240 and the bottom surface 2251 (e.g., the second surface 212 of first panel 210) of the opening 225. The first adhesive regions 251A, 251B, and 251C may be formed wider than the active region 2401 to substantially cover all portions of the active region 2401. That is, the first adhesive regions 251A, 251B, and 251C may be formed to correspond to an entirety of the active region 2401 and a portion of the inactive region 2402. An adhesive member (e.g., an adhesive film) may be applied on the bottom surface 2251 of the opening 225 (e.g., the second surface 212 of the first panel 210) and then may be cured to form the first adhesive regions 251A, 251B, and 251C.

In the illustrated embodiment, the first adhesive regions 251A, 251B, and 251C may be formed in the active region 2401, and may extend from the active region 2401 to the periphery of the active region 2401. For example, a portion of the first adhesive regions 251A, 251B, and 251C may cover a portion of the inactive region 2402 and may extend to a region in which the sensor 240 is not disposed of the bottom surface 2251 of the opening 225 (e.g., the periphery of the inactive region 2402).

In various embodiments, the second adhesive regions 252A, 252B, 252C, and 252D may be formed in a portion of the inactive region 2402 of the sensor 240. An adhesive member may be applied on a portion of the inactive region 2402 and then be cured to form the second adhesive regions 252A, 252B, 252C, and 252D.

In various embodiments, the second adhesive region 252 may be formed a portion of the remainder except for the first adhesive region 251 not to be in contact with the first adhesive region 251. For example, the adhesive member applied to the second adhesive region 252 and the adhesive member applied to the first adhesive region 251 may not be in contact with each other.

In various embodiments, at least a portion of the second adhesive region 252 may be formed between the inactive region 2402 of the sensor 240 and the bottom surface 2251 of the opening 225 (e.g., the second surface 212 of the first panel 210) and the other portion thereof may be formed on a periphery. A second adhesive material may be applied to the bottom surface 2251 (e.g., the second surface 212 of the first panel 210) of the opening 225 and may be cured to form the second adhesive region 252.

In the illustrated embodiment, the second adhesive region 252 may be formed on a portion of the inactive region 2402, and may extend to the periphery of the inactive region 2402. For example, a portion of the second adhesive region 252 may cover a portion of the inactive region 2402, and extend to a region which does not correspond to the sensor 240 (e.g., the periphery of the inactive region 2404) of the bottom surface 2251 of the opening 225.

In various embodiments, the second adhesive region 252 may be formed at a vertex which is formed by two side surfaces connected to each other among the plurality of side surfaces 243A, 243B, 243C, and 243D of the sensor 240 and the bottom surface 2251.

For example, the sensor 240 may have a rectangular parallelepiped shape, and the second adhesive region 252 may be formed to include a plurality of vertices adjacent to the bottom surface 2251 of vertices of the rectangular parallelepiped. An adhesive member may be applied between each of the plurality of vertices and the bottom surface 2251.

In various embodiments, the adhesive member forming the second adhesive region 252 may include an ultraviolet curable material (e.g., an ultraviolet (UV) bond) that is cured by being irradiated with ultraviolet light.

In various embodiments, the second adhesive region 252 may temporarily fix the sensor 240 to the bottom surface 2251 of the opening 225 before a bubble removing process for removing bubbles of the adhesive member included in the first adhesive region 251.

In an embodiment, the sensor 240 may include a center region and an edge region. In this case, the center region may correspond substantially to the active region 2401, and the edge region may correspond to the inactive region 2402.

In various embodiments, the sensor 240 may be electrically connected to a processor of the electronic device 100 through a connecting member 249. The connecting member 249 may extend from the inside of the opening 225 to the outside. For example, the connecting member 249 may include a flexible printed circuit board (FPCB).

FIGS. 6A, 6B, 6C, 6D, 6E, 6F, and 6G are views illustrating a manufacturing process of the display module 200 of the electronic device 100 according to various embodiments of the disclosure.

When the display module 200 is turned upside down with the front of the display (210, 220, 230) facing down and the back of the display (210, 220, 230) facing up, the manufacturing process may be a process of arranging the sensor 240 on the back surface of the display (210, 220, 230).

Figure 6A:
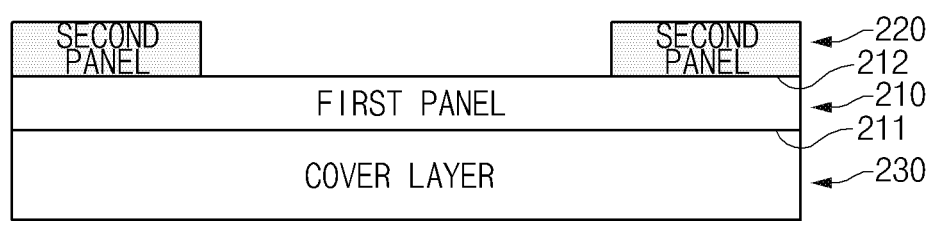
FIGS. 6A, 6B, 6C, 6D, 6E, 6F, and 6G are views illustrating a manufacturing process of a display module of an electronic device according to various embodiments of the disclosure.

In an embodiment, as illustrated in FIG. 6A, the display module 200 may include the cover layer 230, the first panel 210, and the second panel 220. The cover layer 230 may form one surface of a housing. For example, the cover layer 230 may form glass of the front plate of the housing. The first panel 210 may be disposed below the cover layer 230. The first panel 210 may include a plurality of pixels. The first panel 210 may include the first surface 211 that is a front surface and the second surface 212 that is a back surface. The second panel 220 may be disposed below the first panel 210. The second panel 220 may include a plurality of layers. For example, the second panel 220 may include a light shielding layer that prevents light from leaking to the back surface of the display module 200, and an adhesive layer that attaches the second panel 220 to the first panel 210. The display module 200 may include an opening that penetrates the second panel 220 and has the sensor 240 disposed therein.

Figure 6B:
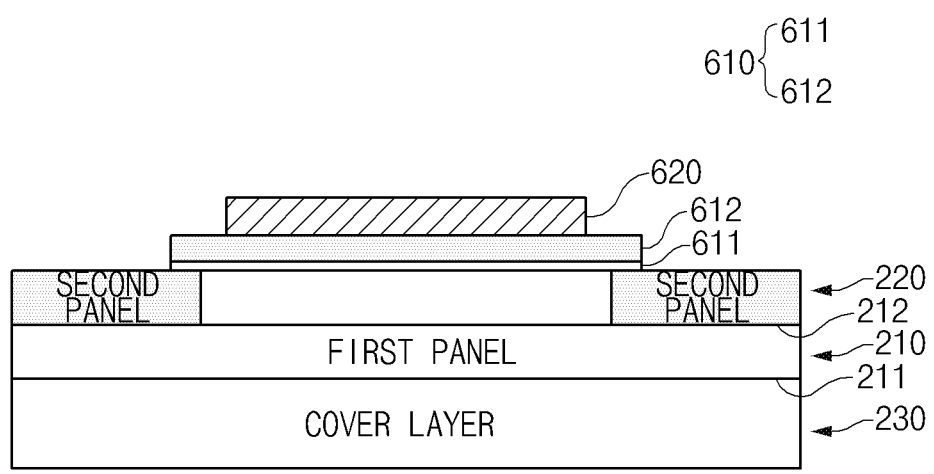

In an embodiment, as illustrated in FIG. 6B, a thermal shrinkage film 610 may be disposed in the opening of the display module 200. The thermal shrinkage film 610 may be disposed to be wider than the width of the opening. The thermal shrinkage film 610 may have a property of shrinking at a temperature higher than or equal to a first temperature that is greater than or equal to 60° C. and less than or equal to 80° C. The thermal shrinkage film 610 may include a first film 611 and a second film 612.

In an embodiment, the first film 611 may be disposed to face the opening of the display module 200. The first film 611 may have adhesiveness at a temperature greater than or equal to the first temperature that is greater than or equal to 60° C. and less than or equal to 80° C. The first film 611 may be a hot melt film having adhesiveness at a high temperature. For example, the first film 611 may be a hot melt film including a polyester adhesive and an epoxy resin.

In an embodiment, the first temperature may be set depending on a material of the first film 611. For example, the first temperature may be set by adjusting a ratio of the polyester adhesive and the epoxy resin. The first temperature may be a softening point of the first film 611. The first temperature may be set to be lower than a threshold temperature of the display module 200. The threshold temperature may be a maximum temperature that is not damaged during the manufacturing process of the display module 200. For example, the first temperature may be set to 80° C. or less.

In an embodiment, the second film 612 may be disposed on a back surface of the first film 611. The second film 612 may shrink at a temperature above the first temperature that is a specified temperature. The second film 612 may include a shrink member and a light shielding member.

In an embodiment, the shrink member may be a material that shrinks at a temperature above the first temperature. For example, the shrink member may be a thermoplastic polyurethane (TPU) film. The light shielding member may be any material that blocks or absorbs light to prevent light from transmitting therethrough. The light shielding member may be a filler having a black color or a color. For example, the light shielding member may be black carbon powder.

In an embodiment, the first film 611 and the second film 612 may be laminated to produce the thermal shrinkage film 610. For example, carbon powder for light-shielding property may be put in the thermoplastic polyurethane film and then laminated with the hot melt film in a stretched state to form the thermal shrinkage film 610.

In an embodiment, a release paper 620 may be disposed on one surface of the thermal shrinkage film 610 in the process of disposing the sensor 240 on the back surface of the display (210, 220, 230). The release paper 620 may be disposed narrower than the width of the opening. The release paper 620 may protect the thermal shrinkage film 610 during the manufacturing process of applying heat.

Figure 6C:
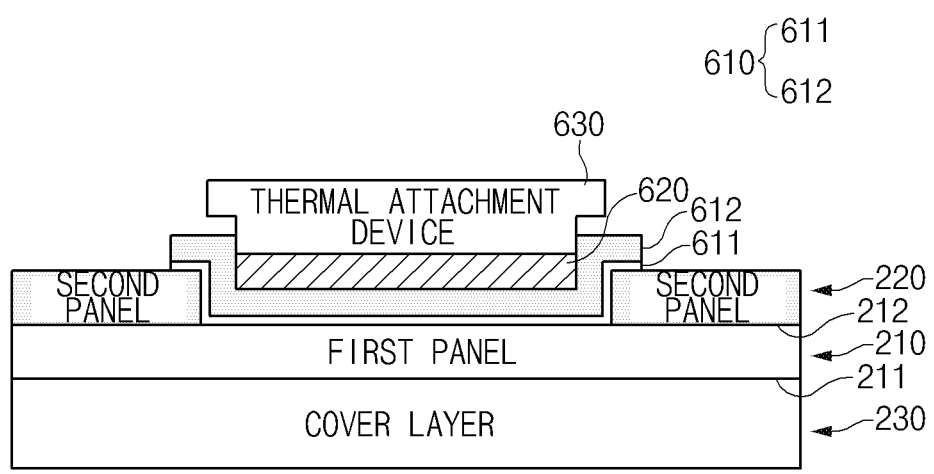
Figure 6D:
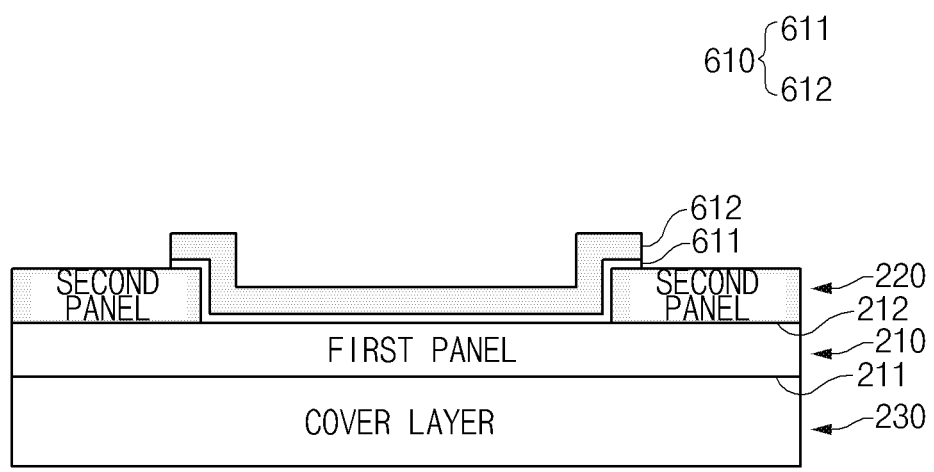

In an embodiment, the thermal shrinkage film 610 may be disposed in contact with the first panel 210 in the opening as shown in FIG. 6C. The thermal shrinkage film 610 may be attached using a thermal attachment device 630. When the thermal attachment device 630 performs the attachment process, the first film 611 may be in contact with the first panel 210. When the thermal attachment device 630 heats the release paper 620, the first film 611 may have a temperature greater than or equal to the first temperature. When the first film 611 has the temperature greater than or equal to the first temperature, as illustrated in FIG. 6D, the first film 611 having adhesiveness may be attached to the first panel 210. Because the first film 611 is attached in a state of fluidity, the thermal shrinkage film 610 may be attached to a corner of the outer edge being in contact with the second panel 220 without bubbles when initially attached.

Figure 6E:
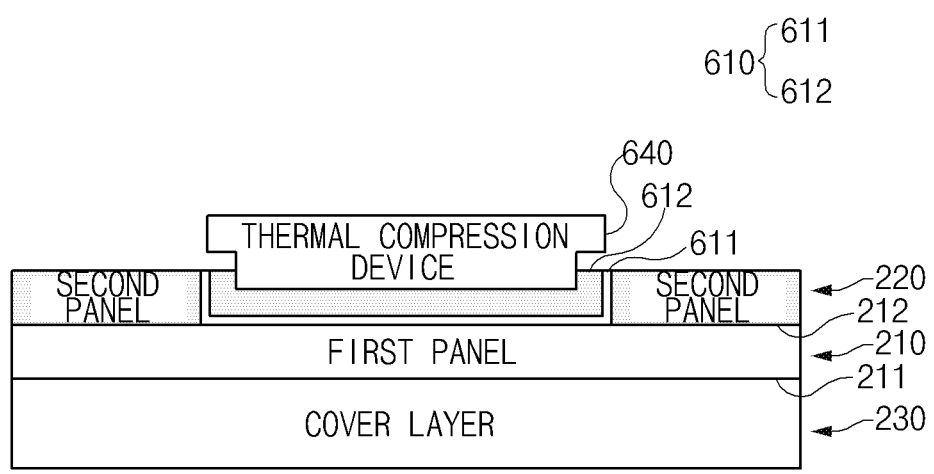
Figure 6F:
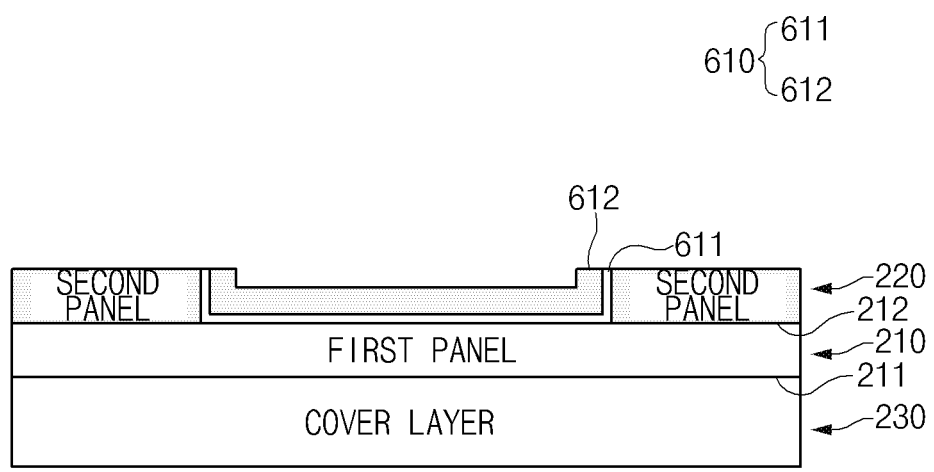

In an embodiment, after removing the release paper 620 as shown in FIG. 6E, the thermal shrinkage film 610 may be compressed at a temperature greater than or equal to the first temperature by using a thermal compression device 640. When the thermal shrinkage film 610 is maintained in a thermo-compressed state, thermal shrinkage may occur in the second film 612. As the thermal shrinkage occurs, the thermal shrinkage film 610 may be disposed to correspond to the opening as shown in FIG. 6F.

In an embodiment, elongation of the second film constituting the thermal shrinkage film 610 may be increased or decreased. The thermal shrinkage film 610 may have a higher elongation than the polyethylene terephthalate (PET) film used as the light shielding film. For example, when the thermal shrinkage film 610 is a composite film composed of a hot melt film and a thermoplastic polyurethane film layer, the thermal shrinkage film 610 may have a shrinkage of about 5% or more and about 7% or less.

Figure 6G:
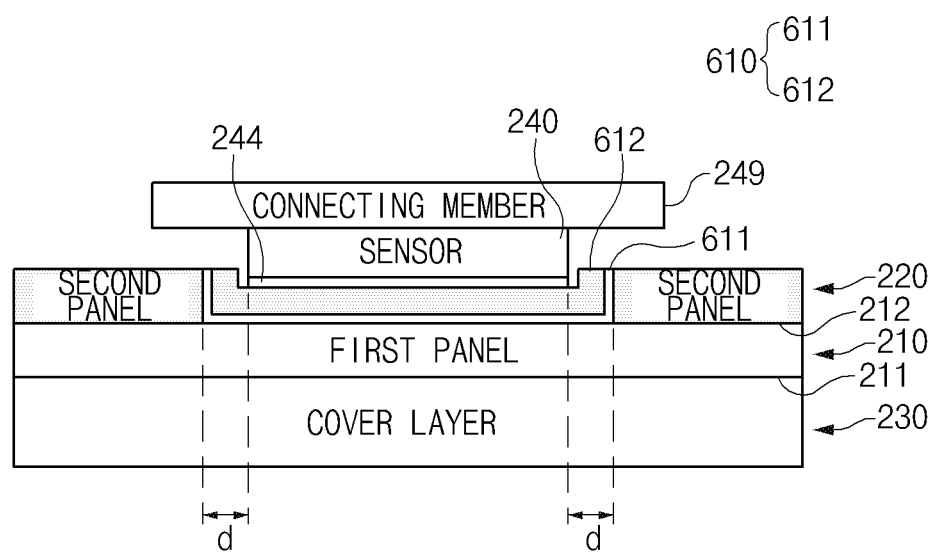

In an embodiment, as shown in FIG. 6G, the sensor 240 may be disposed to complete the display module 200. The sensor 240 may be coupled to the display module 200. The sensor 240 may be disposed on one surface of the thermal shrinkage film 610 using an adhesive member 244. The sensor 240 may form a sensing region on one surface of the housing. For example, the sensor 240 may sense a user's fingerprint in the sensing region. The sensor 240 may be connected to the processor using the connecting member 249. The connecting member 249 may include an FPCB in which wires for transferring information sensed by the sensor 240 to the processor are formed.

In an embodiment, a specific distance "d" may be formed between the sensor 240 and the second panel 220. The thermal shrinkage film 610 may be disposed to correspond to the opening while the thermal shrinkage film 610 disposed on the sensor 240 contracts at the temperature greater than or equal to the first temperature. The specific distance "d" (e.g., an air gap) formed in an edge outer region of the second panel 220 may be filled with the second film 612 without gaps. Accordingly, a problem that the sensor 240 is visually recognized from the front of the display module 200 may be prevented.

Figure 7:
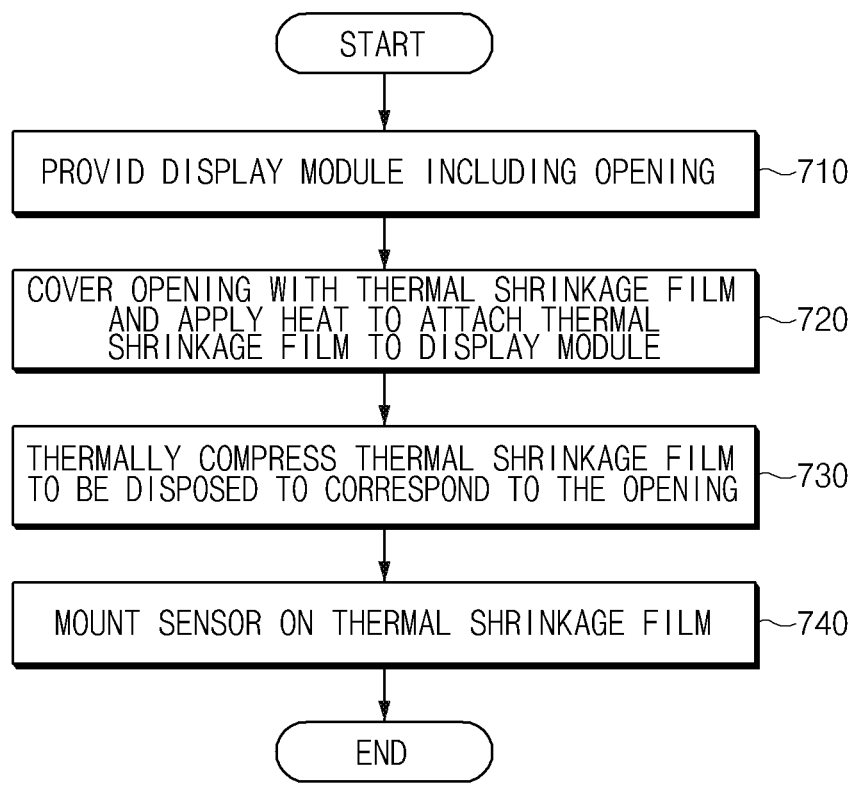
FIG. 7 is a flowchart illustrating a manufacturing process of a display module of an electronic device according to an embodiment of the disclosure.

FIG. 7 is a flowchart illustrating a manufacturing process of the display module 200 of the electronic device 100 according to an embodiment of the disclosure.

In the manufacturing process of the display module 200 according to an embodiment, the display module 200 including the opening may be provided in operation 710. The opening may pass through the second panel 220 of the display module 200 and may be a space in which the sensor 240 may be disposed.

In the manufacturing process of the display module 200 according to an embodiment, the opening may be covered with the thermal shrinkage film 610 and apply heat to allow the thermal shrinkage film 610 to be attached to the display module 200 in operation 720. The thermal shrinkage film 610 may be attached to the display module 200 while the heat is applied to the thermal shrinkage film 610 to allow the first film 611 to be dissolved. The release paper 620 may be disposed on one surface of the second film 612 to prevent shrinkage of the second film 612.

In the manufacturing process of the display module 200 according to an embodiment, the thermal shrinkage film 610 may be contracted by thermal compression to be disposed to correspond to the opening in operation 730. When the release paper 620 is removed and the thermal compression is maintained, the second film 612 may be contracted while the thermal shrinkage film 610 may be disposed to correspond to the opening.

In the manufacturing process of the display module 200 according to an embodiment, the sensor 240 may be mounted on the thermal shrinkage film 610 in operation 740. The sensor 240 may be disposed in the opening of the display module 200.

FIGS. 8A, 8B, 8C, 8D, 8E, 8F, and 8G are views illustrating a manufacturing process of the display module 200 of the electronic device 100 according to various embodiments of the disclosure.

When the display module 200 is turned upside down with the front of the display (210, 220, 230) facing down and the back of the display (210, 220, 230) facing up, the manufacturing process may be a process of arranging the sensor 240 on the back surface of the display (210, 220, 230).

Figure 8A:
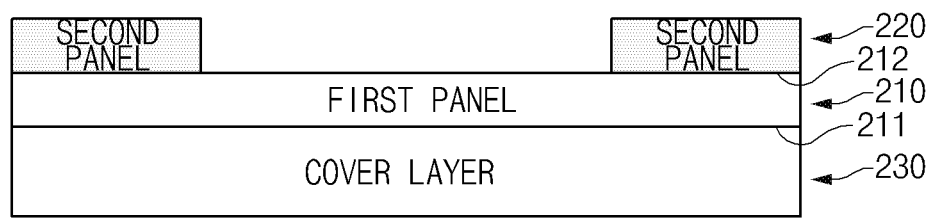
FIGS. 8A, 8B, 8C, 8D, 8E, 8F, and 8G are views illustrating a manufacturing process of a display module of an electronic device according to various embodiments of the disclosure.

In an embodiment, as illustrated in FIG. 8A, the display module 200 including the opening may be prepared. The display module 200 of FIG. 8A may be substantially the same as the display module 200 of FIG. 6A.

Figure 8B:
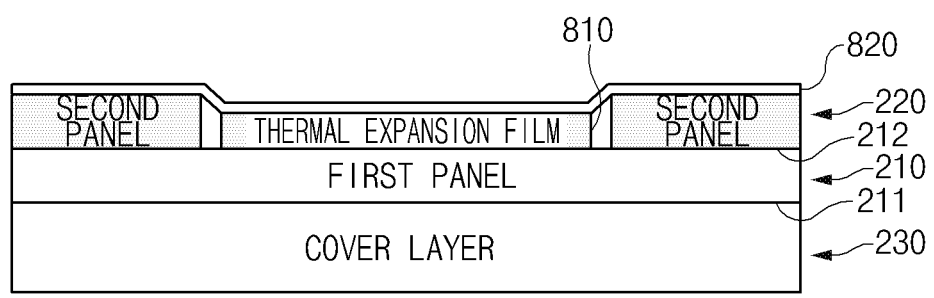

In an embodiment, a thermal expansion film 810 may be disposed in the opening, as shown in FIG. 8B. The thermal expansion film 810 may be disposed in the opening of the display module 200. The thermal expansion film 810 may be disposed smaller than the width of the opening. The thermal expansion film 810 may have a property of expanding at a temperature higher than or equal to the first temperature that is greater than or equal to 60° C. and less than or equal to 80° C. The thermal expansion film 810 may include a flow initiator, a photo initiator, and a light shielding member.

In an embodiment, the flow initiator may have fluidity at a temperature above the first temperature that is at least greater than or equal to 60° C. and less than or equal to 80° C. For example, the flow initiator may be an oil that dissolves at a temperature above the first temperature. The photo initiator may be cured in response to light. For example, the photo initiator may be a UV initiator that responds to ultraviolet (UV) light. The light shielding member may be black carbon powder.

In an embodiment, the thermal expansion film 810 may further include a novolak resin, which is a base material, and an epoxy resin. The thermal expansion film 810 may be blended with the flow initiator, the photo initiator, and the light shielding member in the base material to have fluidity, curability to light, and light shielding at a temperature higher than or equal to the first temperature. The first temperature may be set by physical properties of the base material, a blending ratio of the flow initiator, and/or the blending ratio of the photo initiator. The first temperature may be a softening point of the thermal expansion film 810. The fluidity of the thermal expansion film 810 may be set by the blending ratio of the flow initiator, a particle size of the light shielding member, and/or a blending ratio of the light shielding member.

In an embodiment, a release paper 820 may be disposed on one surface of the thermal expansion film 810 in the process of placing the sensor 240 on the back surface of the display (210, 220, 230). The release paper 820 may be disposed wider than the width of the opening. The release paper 820 may protect the thermal expansion film 810 during the manufacturing process of applying heat and curing.

Figure 8C:
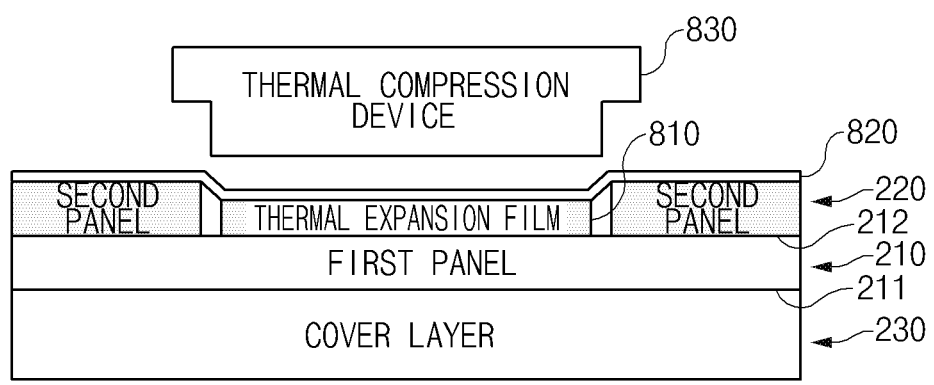
Figure 8D:
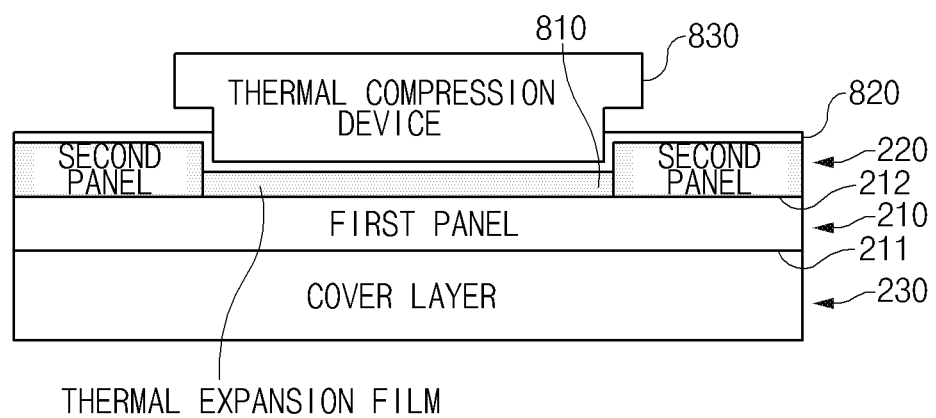

In an embodiment, the thermal expansion film 810 may be disposed in contact with the first panel 210 in the opening, as shown in FIG. 8C. Before thermal compression, the thermal expansion film 810 may be disposed smaller than the area of the opening. When a thermal compression device 830 is pressed while applying heat onto the release paper 820, the thermal expansion film 810 may have a temperature greater than or equal to the first temperature. When the thermal expansion film 810 has the temperature greater than or equal to the first temperature, the thermal expansion film 810 may have fluidity to flow to correspond to the opening, as shown in FIG. 8D. Because the thermal expansion film 810 fills the opening in a state of fluidity, the thermal expansion film 810 may cover the opening, and thus a gap does not occur in an edge portion of the outer surface being in contact with the second panel 220.

Figure 8E:
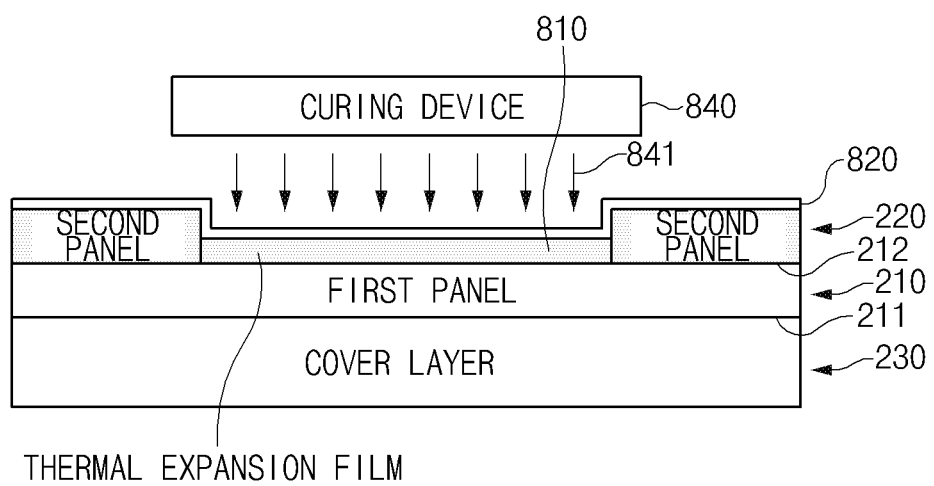

In an embodiment, the thermal expansion film 810 may be cured using a curing device 840 as shown in FIG. 8E. The curing device 840 may irradiate a light 841 onto the thermal expansion film 810 to react the photo initiator included in the thermal expansion film 810. For example, when the UV initiator is included, the curing device 840 may irradiate ultraviolet rays to generate UV curing. The UV initiator may generate a crosslinking reaction between the base material of the polymer film and the epoxy resin. After the crosslinking reaction, the softening point of the thermal expansion film 810 may be deformed to a temperature higher than the first temperature. For example, the softening point of the thermal expansion film 810 may be deformed to about 100° C. or more. In a case where hardness of the thermal expansion film 810 is increased through UV curing after transferring the thermal expansion film 810, the sensor 240 may be more stably attached and sensing performance of recognizing external information may be improved, as compared with a case of the flexible adhesive layer.

Figure 8F:
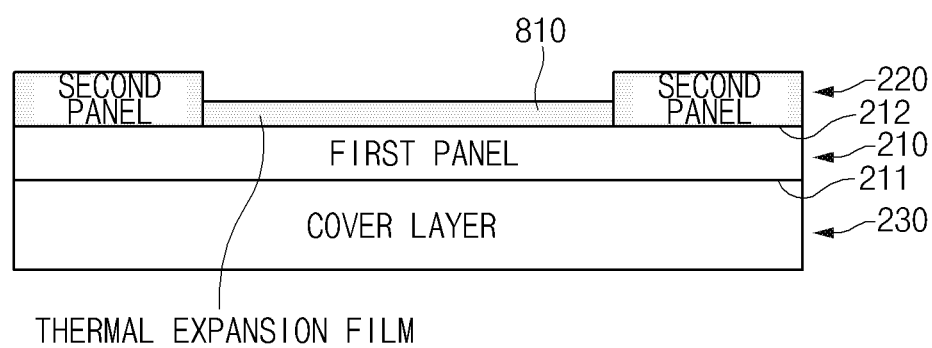
Figure 8G:
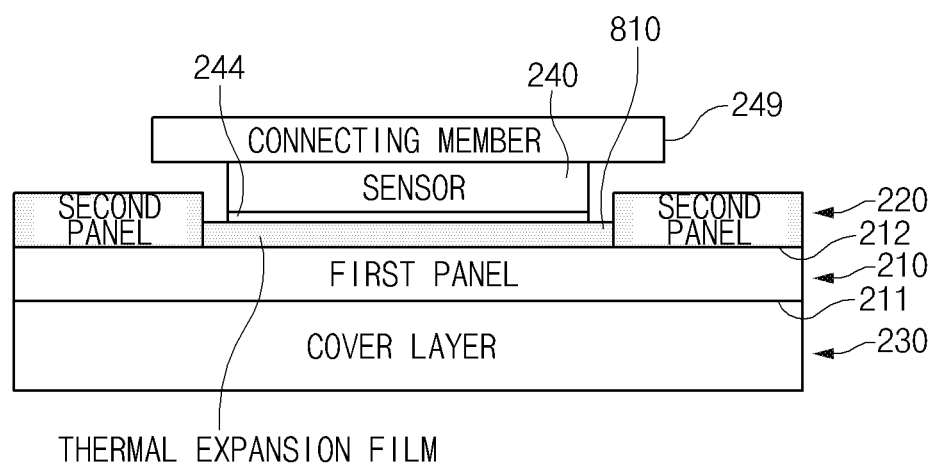

In an embodiment, after removing the release paper 820 as shown in FIG. 8F, the sensor 240 may be disposed as shown in FIG. 8G. The sensor 240, the adhesive member 244, and the connecting member 249 of FIG. 8G may be substantially the same as the sensor 240, the adhesive member 244, and the connecting member 249 of FIG. 6G.

Figure 9:
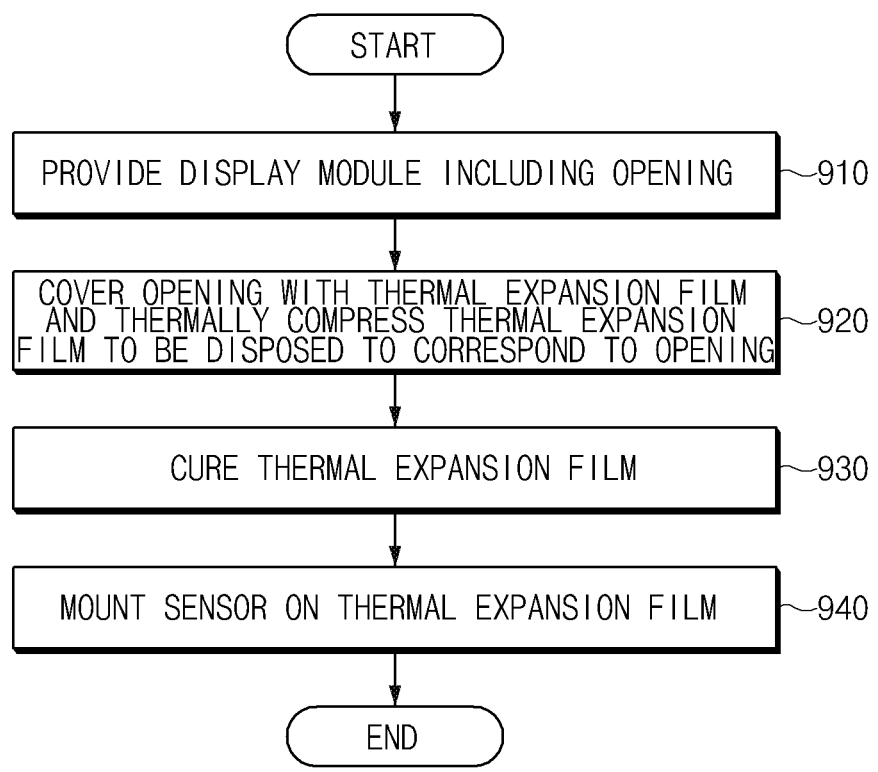
FIG. 9 is a flowchart illustrating a manufacturing process of a display module of an electronic device according to an embodiment of the disclosure.

FIG. 9 is a flowchart illustrating a manufacturing process of the display module 200 of the electronic device 100 according to an embodiment of the disclosure.

In the manufacturing process of the display module 200 according to an embodiment, the display module 200 including the opening may be provided in operation 910. The opening may pass through the second panel 220 of the display module 200 and may be a space in which the sensor 240 may be disposed.

In the manufacturing process of the display module 200 according to an embodiment, the opening may be covered with the thermal expansion film 810 and thermally compress the thermal expansion film 810 to be disposed correspond to the opening in operation 920. The release paper 820 may be disposed on one surface of the thermal expansion film 810 to perform thermal compression on the thermal expansion film 810. When thermal compression is maintained on the thermal expansion film 810, the thermal expansion film 810 may have a temperature higher than or equal to the first temperature. When the thermal expansion film 810 has a temperature above the first temperature, the thermal expansion film 810 may have fluidity. The thermal expansion film 810 having fluidity may be uniformly compressed to spread the thermal expansion film 810 to correspond to the opening of the display module 200.

In the manufacturing process of the display module 200 according to an embodiment, the thermal expansion film 810 may be cured in operation 930. When the light is irradiated onto the thermal expansion film 810, the softening point of the thermal expansion film 810 may be increased. When the softening point of the thermal expansion film 810 increases, the fluidity of the thermal expansion film 810 may decrease. The thermal expansion film 810 with reduced fluidity may be cured in an unfolded state to correspond to the opening.

In the manufacturing process of the display module 200 according to an embodiment, the sensor 240 may be mounted on the thermal expansion film 810 in operation 940. The sensor 240 may be disposed in the opening of the display module 200.

Figure 10A:
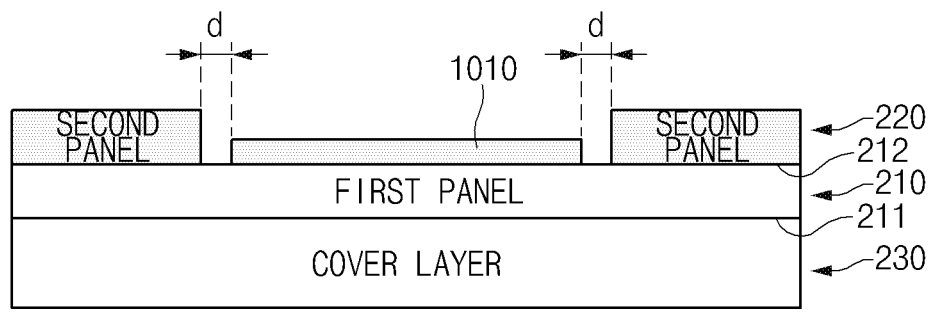
FIGS. 10A, 10B, and 10C are diagrams illustrating a manufacturing process of a display module of an electronic device according to various embodiments of the disclosure.
Figure 10B:
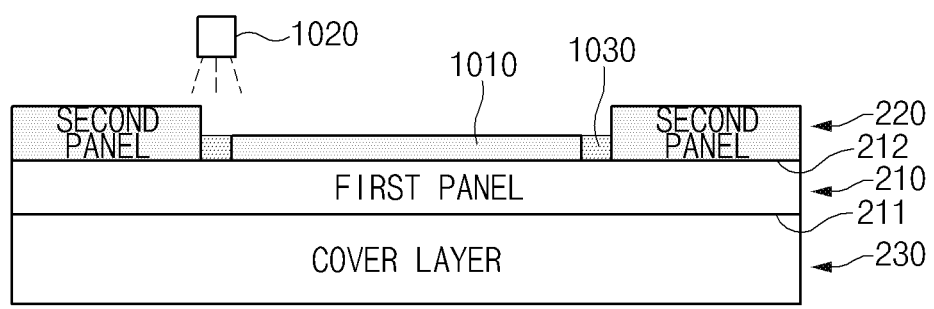
Figure 10C:
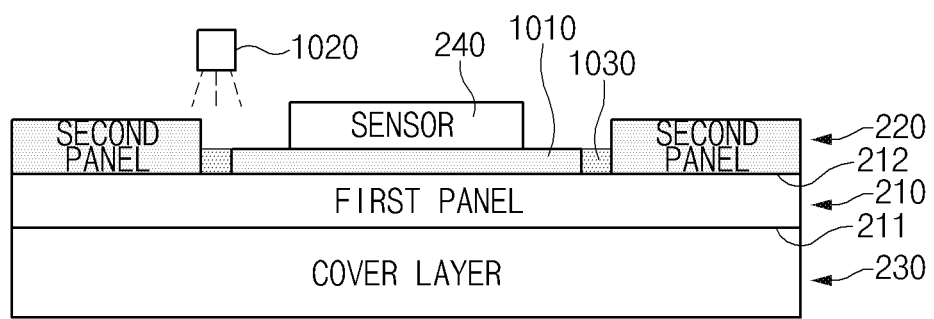

FIGS. 10A, 10B, and 10C are views illustrating a manufacturing process of the display module 200 of the electronic device 100 according to various embodiments of the disclosure.

When the display module 200 is turned upside down with the front of the display (210, 220, 230) facing down and the back of the display (210, 220, 230) facing up, the manufacturing process may be a process of arranging the sensor 240 on the back surface.

In an embodiment, as shown in FIG. 10A, the display module 200 including the opening may be prepared and a film 1010 may be disposed to be in contact with the first panel 210. The display module 200 of FIG. 10A may be substantially the same as the display module 200 of FIG. 6A.

In an embodiment, the film 1010 may include a light shielding member for preventing a phenomenon that light is incident or reflected on the back surface of the first panel 210. For example, the film 1010 may include black polyethylene terephthalate (PET).

In an embodiment, the film 1010 may transmit an ultrasonic signal transmitted between the display module 200 and the sensor 240 to have a specified intensity or more. When the film 1010 transmits the ultrasonic signal more than the specific intensity, information (e.g., biometric information such as a fingerprint) input from the front surface of the display module 200 may be converted into an ultrasonic form and transmitted to the sensor 240 or may minimize attenuation of the signal when the signal is transmitted from the sensor 240 to the sensing region.

In an embodiment, the film 1010 may be disposed smaller than the width of the opening. A specific distance "d" may be formed between the film 1010 and the second panel 220. The specific distance "d" may be a tolerance generated when the film 1010 is disposed in the opening of the display module 200. For example, the film 1010 may be attached to the second surface 212 of the first panel 210 to be spaced apart from the second panel 220 by a specific distance "d", in order to prevent the film 1010 from overlapping the second panel 220 when attaching the film 1010.

In an embodiment, as shown in FIG. 10B, a specific distance "d" between the film 1010 and the second panel 220 may be filled by applying a resin 1030. The resin 1030 may be applied using a coating device 1020. The resin 1030 may be a resin having fluidity and light shielding property. For example, the resin 1030 may be an epoxy resin.

In an embodiment, an autoclave process may be performed to remove bubbles between the film 1010 and the resin 1030 and inside the resin 1030. For example, a temperature above a melting point of the resin 1030 may be maintained in the autoclave process to increase fluidity of resin 1030, thereby removing the bubbles.

In an embodiment, the sensor 240 may be disposed as shown in FIG. 10C. The sensor 240 of FIG. 10C may be substantially the same as the sensor 240 of FIG. 6G.

Figure 11:
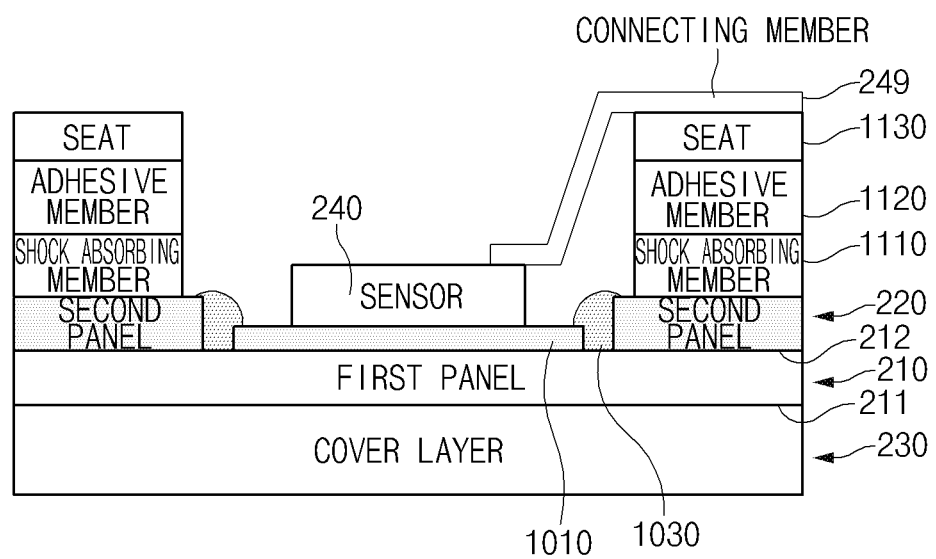
FIG. 11 is a diagram illustrating a display module of an electronic device according to an embodiment of the disclosure.

FIG. 11 is a view illustrating the display module 200 of the electronic device 100 according to an embodiment of the disclosure.

The first panel 210, the second panel 220, the cover layer 230, the film 1010, the resin 1030, and the sensor 240 of the display module 200 may be substantially the same as the first panel 210, the second panel 220, the cover layer 230, the film 1010, the resin 1030, and the sensor 240 of the display module 200 of FIG. 10C. A shock absorbing member 1110, an adhesive member 1120, and a sheet 1130 may be disposed on the back surface of the second panel 220.

In an embodiment, the shock absorbing member 1110 may be disposed on the back surface of the second panel 220. The shock absorbing member 1110 may be disposed to have a smaller width than the second panel 220. The shock absorbing member 1110 may protect the back surface of the second panel 220 from impact. For example, the shock absorbing member 1110 may be a sponge.

In an embodiment, the shock absorbing member 1110 may be disposed to be spaced apart from the resin 1030 by a certain space. When the shock absorbing member 1110 is in contact with the resin 1030, shock absorbing performance of the shock absorbing member 1110 and/or the fluidity and light shielding property of the resin 1030 may be reduced. The shock absorbing member 1110 may be disposed in a stepped structure farther from the sensor 240 than the second panel 220 to be spaced apart from the resin 1030 by a specific distance.

In an embodiment, the adhesive member 1120 may be disposed on one surface of the shock absorbing member 1110. The sheet 1130 may be disposed on one surface of the adhesive member 1120. The adhesive member 1120 may attach the sheet 1130 to correspond to the shock absorbing member 1110. The sheet 1130 may be a composite sheet. For example, the sheet 1130 may be a composite sheet made of a polymer material.

Figure 12:
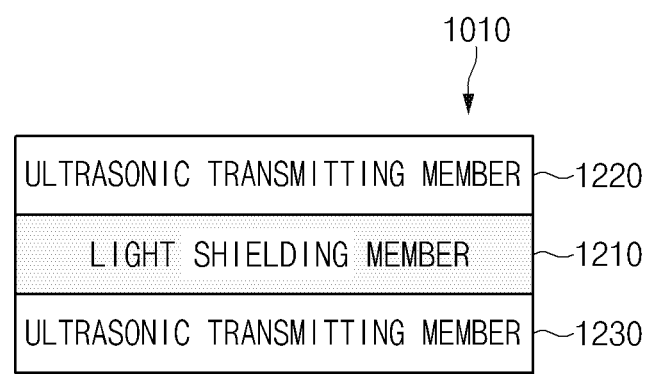
FIG. 12 is a diagram illustrating a film of an electronic device according to an embodiment of the disclosure.

FIG. 12 is a view illustrating the film 1010 of the electronic device 100 according to an embodiment of the disclosure.

In an embodiment, the film 1010 may include a light shielding member 1210 and ultrasonic transmitting members 1220 and 1230 disposed on at least one surface of the light shielding member 1210.

In an embodiment, the light shielding member 1210 may include a material having color and light shielding property. For example, the light shielding member 1210 may be black polyethylene terephthalate.

In an embodiment, the ultrasonic transmitting members 1220 and 1230 may include a material that transmits an ultrasonic signal transmitted between the display module 200 and the sensor 240 to have a specified intensity or more. For example, each of the ultrasonic transmitting members 1220 and 1230 may include an adhesive layer that is ultrasonically matched with the first panel 210 and the sensor 240 by increasing ultrasonic impedance.

Figure 13:
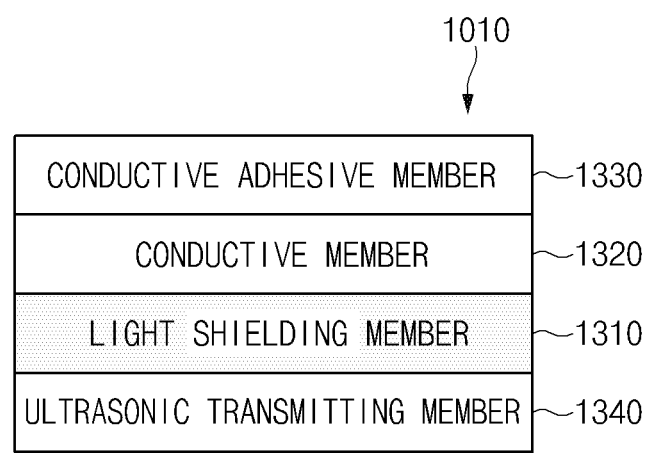
FIG. 13 is a diagram illustrating a film of an electronic device according to an embodiment of the disclosure.

FIG. 13 is a view illustrating the film 1010 of the electronic device 100 according to an embodiment of the disclosure.

In an embodiment, a conductive member 1320 may be further disposed on at least one surface of a light shielding member 1310. The conductive member 1320 may be a metal member disposed to be adjacent to the light shielding member 1310. For example, the light shielding member 1310 may be a black coated film and the conductive member 1320 may be a copper sheet formed on one surface of the light shielding member 1310.

In an embodiment, a conductive adhesive member 1330 may be disposed on one surface of the conductive member 1320. The conductive adhesive member 1330 may include an adhesive material to allow the conductive member 1320 to adhere to the sensor 240. An ultrasonic transmitting member 1340 may be disposed on one surface of the light shielding member 1310.

In an embodiment, the ultrasonic transmitting member 1340 may have a single layer or may have a plurality of layers including a base layer and an adhesive layer. The ultrasonic transmitting member 1340 may be disposed in consideration of an operation frequency "f" of the sensor 240 mounted on the display module 200 of the electronic device 100 and a wavelength "λ" corresponding thereto. A thickness of a layer included in the ultrasonic transmitting member 1340 may be formed to be ½ of the wavelength "λ" corresponding to the operating frequency "f". For example, the thickness of the layer included in the ultrasonic transmitting member 1340 may be formed to have a thickness of n λ/2 ("n" is a natural number) with respect to a length of the ultrasonic wave wavelength "λ" emitted from the sensor 240. Accordingly, the thickness of at least one of the base layer and the adhesive layer included in the ultrasonic transmitting member 1340 may have a thickness of ½ times, 3/2 times, or 5/2 times the ultrasonic wave wavelength "λ".

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory storage medium" means a tangible device, and does not include a signal (e.g., an electromagnetic wave), but this term does not differentiate between where data is semi-permanently stored in the storage medium and where the data is temporarily stored in the storage medium. For example, "the non-transitory storage medium" may include a buffer where data is temporally stored.

According to an embodiment, a method according to various embodiments of the disclosure may be included and provided in a computer program product. The computer program product may be traded as a product between a seller and a buyer. The computer program product (e.g., downloadable app)) may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to embodiments disclosed herein, the polymer film which is deformed by heat at a specific temperature may be attached on the back surface of the display, the thermal compression may be performed to remove the gap between the light shielding member and the sensor, and the sensor may be disposed on the back surface of the film, thereby solving the problem of the sensor being visually recognized.

In addition, according to embodiments disclosed herein, the problem that the light shielding member deteriorates the performance of the sensor may be prevented while the gap generated between the light shielding member and the sensor by the deviation, such as manufacturing tolerances, may be removed, thereby solving the problem of the sensor being visually recognized.

Furthermore, according to embodiments disclosed herein, the rear reflection between the display and the sensor by air gap may be reduced, and thus the problem that the sensor is visually recognized by the external light is prevented.

In addition, various effects may be provided that are directly or indirectly understood through the present document.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing;
a display module configured to include:
   a cover layer forming one surface of the housing,
   a first panel disposed below the cover layer and including a plurality of pixels, and
   a second panel disposed below the first panel and including a plurality of layers; and
a sensor configured to be coupled to the display module and forming a sensing region on the one surface of the housing,
wherein the display module includes an opening which penetrates the second panel, the sensor being disposed in the second panel,
wherein a thermal shrinkage film is disposed in the opening to be in contact with the first panel, and
wherein the thermal shrinkage film includes:
   a first film in contact with the first panel and having adhesion at a temperature above a first temperature, and
   a second film including:
      a shrinking member, which contracts at a temperature greater than or equal to the first temperature, and
      a light shielding member.

2. The electronic device of claim 1, wherein the thermal shrinkage film is disposed to correspond to the opening while the thermal shrinkage film contracts at a temperature above the first temperature.

3. The electronic device of claim 1,
wherein the first temperature is greater than or equal to 60° C. and less than or equal to 80° C.,
wherein the first temperature comprises a softening point before the thermal shrinkage film contracts, and
wherein the softening point is set to be lower than a threshold temperature of the display module.

4. The electronic device of claim 1, wherein the first film includes:
a polyester hot melt adhesive; and
an epoxy resin having adhesion at the first temperature.

5. The electronic device of claim 4, wherein the shrinking member comprises a thermoplastic polyurethane that contracts at the first temperature.

6. The electronic device of claim 1, wherein the light shielding member comprises a black carbon powder filler.

7. The electronic device of claim 1, wherein the thermal shrinkage film removes a gap between the thermal shrinkage film and the second panel while the thermal shrinkage film shrinks at a temperature greater than or equal to the first temperature.

8. The electronic device of claim 1, further comprising:
a connecting member disposed on the sensor and connecting the sensor to at least one processor, wherein the connecting member includes a flexible printed circuit board (FPCB).

9. An electronic device comprising:
a housing;
a display module configured to include:
   a cover layer forming one surface of the housing,
   a first panel disposed below the cover layer and including a plurality of pixels, and
   a second panel disposed below the first panel and including a plurality of layers; and
a sensor configured to be coupled to the display module and form a sensing region on the one surface of the housing,
wherein the display module includes an opening which penetrates the second panel, the sensor being disposed in the second panel,
wherein a thermal expansion film is disposed in the opening to be in contact with the first panel, and
wherein the thermal expansion film includes:
   a flow initiator having fluidity at a temperature above a first temperature,
   a photo initiator reacting to ultraviolet (UV) light, and
   a light shielding member.

10. The electronic device of claim 9, wherein the thermal expansion film is disposed to correspond to the opening while the thermal expansion film expands at a temperature greater than or equal to the first temperature.

11. The electronic device of claim 9,
wherein the first temperature is greater than or equal to 60° C. and less than or equal to 80° C.,
wherein the first temperature is a softening point before the thermal expansion film expands, and
wherein the softening point is set to be lower than a threshold temperature of the display module.

12. The electronic device of claim 9, wherein the thermal expansion film further includes:
a novolak resin, the novolak resin being a base material; and
an epoxy resin.

13. The electronic device of claim 12, wherein the photo initiator generates a crosslinking reaction between the novolak resin and the epoxy resin when exposed to the ultraviolet light to deform a softening point of the thermal expansion film to a second temperature higher than the first temperature.

14. The electronic device of claim 9, wherein the light shielding member is a black carbon powder filler.

15. The electronic device of claim 9, wherein the thermal expansion film removes a gap between the thermal expansion film and the second panel while the thermal expansion film expands at a temperature greater than or equal to the first temperature.

16. An electronic device comprising:
a housing;
a display module configured to include:
   a cover layer forming one surface of the housing,
   a first panel disposed below the cover layer and including a plurality of pixels, and
   a second panel disposed below the first panel and including a plurality of layers; and
a sensor configured to be coupled to the display module and form a sensing region on the one surface of the housing,
wherein the display module includes an opening which penetrates the second panel, the sensor being disposed in the second panel,
wherein a film is disposed in the opening to be in contact with the first panel,
wherein a resin is applied to a gap between the film and the second panel, and
wherein the film includes a light shielding member and an ultrasonic transmitting member disposed on at least one surface of the light shielding member.

17. The electronic device of claim 16, wherein the light shielding member comprises black polyethylene terephthalate (PET).

18. The electronic device of claim 16, wherein the ultrasonic transmitting member includes a material that transmits an ultrasonic signal transmitted between the display module and the sensor, the ultrasonic signal being greater or equal to a specific intensity.

19. The electronic device of claim 16, further comprising:
a metal member disposed on at least one surface of the light shielding member.

20. The electronic device of claim 16,
wherein the resin comprises an epoxy resin, and
wherein bubbles are removed between the film and the resin and inside the resin via an autoclave process.

21. The electronic device of claim 20, wherein, in the autoclave process, a temperature above a melting point of the resin is maintained to increase fluidity of the resin.

22. The electronic device of claim 16, wherein the resin includes a light shielding property.

23. The electronic device of claim 16, further comprising:
a shock absorbing member contacting the second panel.

* * * * *